United States Patent
Matuschek et al.

(10) Patent No.: US 7,099,361 B2
(45) Date of Patent: Aug. 29, 2006

(54) LASER SOURCE WITH HIGH RELATIVE FEEDBACK AND METHOD FOR MAKING SUCH A LASER SOURCE

(75) Inventors: Nicolai Matuschek, Zurich (CH); Stefan Mohrdiek, Baech (CH); Tomas Pliska, Hausen/Albis (CH)

(73) Assignee: Bookham Technology plc, Northamptonshire (GB)

( * ) Notice: Subject to any disclaimer, the term of this patent is extended or adjusted under 35 U.S.C. 154(b) by 253 days.

(21) Appl. No.: 10/775,302

(22) Filed: Feb. 10, 2004

(65) Prior Publication Data
US 2004/0170209 A1 Sep. 2, 2004

(30) Foreign Application Priority Data
Feb. 13, 2003 (GB) .................. 0303271.1

(51) Int. Cl.
H01S 3/13 (2006.01)
H01S 3/08 (2006.01)
(52) U.S. Cl. .............. 372/29.021; 372/29.02; 372/99
(58) Field of Classification Search ........... 372/29.021
See application file for complete search history.

(56) References Cited

U.S. PATENT DOCUMENTS

| | | | |
|---|---|---|---|
| 3,875,422 A * | 4/1975 | Stolen | 359/330 |
| 5,563,732 A | 10/1996 | Erdogan et al. | |
| 6,525,872 B1 * | 2/2003 | Ziari et al. | 359/341.3 |
| 2002/0136254 A1 * | 9/2002 | Yoshida et al. | 372/45 |
| 2002/0159489 A1 | 10/2002 | Wolak et al. | |

FOREIGN PATENT DOCUMENTS

| | | |
|---|---|---|
| EP | 0 991 153 | 1/1999 |
| EP | 1 087 479 | 9/1999 |
| EP | 1 059 711 | 6/2000 |
| EP | 1 139 523 A2 | 10/2001 |
| JP | 10-62654 | 3/1998 |
| WO | WO 00/48276 A | 8/2000 |

OTHER PUBLICATIONS

Search Report for corresponding GB application GB 0303271.1, dated Aug. 27, 2003.
European Search Report regarding Application No. PCT/IB2004/000389 dated Sep. 2, 2004.
"Frequency Locking Using Cascaded Fibre Bragg Gratings in OFDM Systems" Park, C.S. et al., Electronic Letters, vol. 32 Issue :12, Jun. 6, 1996, pp. 1120-1122.

* cited by examiner

*Primary Examiner*—Armando Rodriguez
(74) *Attorney, Agent, or Firm*—Renner, Otto, Boisselle and Sklar, LLP

(57) ABSTRACT

The invention relates to the stabilization of high power semiconductor laser diode sources as they are extensively used in the field of optical communication. Such lasers are mostly employed as so-called pump laser sources for fiber amplifiers, e.g. erbium-doped fiber amplifiers, and are designed to provide a narrow-bandwidth optical radiation with a stable power output in a given frequency band. To improve the wavelength locking range of such laser sources when operating without an active temperature stabilizing element, an external reflector providing very high relative feedback is used. The reflectivity bandwidth of the external reflector is broadened for improving the stability of the laser source. In commonly employed optical fibers for conducting the laser beam, the external reflector is formed by one or a plurality of appropriately designed fiber Bragg gratings.

28 Claims, 15 Drawing Sheets

LASER SOURCE WITH HIGH RELATIVE FEEDBACK AND METHOD FOR MAKING SUCH A LASER SOURCE

FIELD OF THE INVENTION

The invention relates to the stabilization of a laser, specifically a semiconductor diode laser of the type commonly used in opto-electronics, mostly as so-called pump lasers for fiber amplifiers in the field of optical communication, e.g. for erbium-doped fiber amplifiers. Such lasers are designed to provide a narrow-bandwidth optical radiation with a stable power output in a given frequency band. In particular, the invention relates to a laser using an external reflector providing very high relative feedback such that the laser is capable of stable operation without the need for an active temperature stabilizing element.

BACKGROUND AND PRIOR ART

Semiconductor lasers of the type mentioned above have, for example, become important components in the technology of optical communication, particularly because such lasers can be used for amplifying optical signals immediately by optical means. This allows to design all-optical fiber communication systems, avoiding any complicated conversion of the signals to be transmitted which improves speed as well as reliability within such systems.

In one kind of optical fiber communication systems, the lasers are used for pumping erbium-doped fiber amplifiers, so-called EDFAs, which have been described in various patents and publications known to the person skilled in the art. An example of some technical significance are 980 nm lasers with a power output of 100 mW or more, which wavelength matches the 980 nm erbium absorption line and thus achieves a low-noise amplification. InGaAs lasers have been found to serve this purpose well and are used today in significant numbers. However, the invention is in no way limited to InGaAs lasers.

There are examples of lasers of other wavelengths and materials for which the present invention is applicable. Generally, laser diode pump sources used in fiber amplifier applications are working in single transverse mode for efficient coupling into single-mode fibers and are mostly multiple longitudinal mode lasers, i.e. Fabry-Perot (FP) lasers. Three main types are typically used for erbium amplifiers, corresponding to the absorption wavelengths of erbium: InGaAsP and multiquantum-well InGaAs lasers are used at 1480 nm; strained quantum-well InGaAs lasers at 980 nm; and GaAIAs lasers at 820 nm.

One of the problems occurring when using semiconductor lasers for the above purpose is their wavelength and power output instability which, though small, still affects the amplification sufficiently to look for a solution to the problem. This problem is already addressed in U.S. Pat. No. 5,563,732 by Erdogan et al., entitled "Laser Pumping of Erbium Amplifier", which describes the stabilization of a pump laser of the type described above by use of a Bragg grating in front of the laser. This grating forms an external cavity with the laser. The emission spectrum is stabilized by the reflection from the grating. The grating is formed inside the guided-mode region of the optical fiber at a certain distance from the laser. Such a fiber Bragg grating is a periodic (or aperiodic) structure of refractive index variations in or near the guided-mode portion of the optical fiber, which variations are reflecting light of a certain wavelength propagating along the fiber. The grating's peak-reflectivities and reflection bandwidths determine the amount of light reflected back into the laser.

Ventrudo et al. U.S. Pat. No. 5,715,263, entitled "Fibre-grating-stabilized Diode Laser" describes an essentially similar approach for providing a stabilized laser, showing a design by which the laser light is coupled to the fiber by focussing it through a fiber lens. Again, a fiber Bragg grating is provided in the fiber's guided mode portion, reflecting part of the incoming light back through the lens to the laser. To summarize, when positioning a fiber Bragg grating at a certain distance from the laser's front facet and when the laser gain peak is not too far from the Bragg grating's center wavelength, it is understood that the laser is forced to operate within the optical bandwidth of the grating and thus is wavelength-stabilized. Additionally, low-frequency power fluctuations seem to decrease by the effect of induced high-frequency multi-mode operation.

Though the above stabilization methods are effective, they all use active temperature stabilizing elements. None of the above prior art addresses solutions for high power (i.e. >100 mW) laser sources capable of stable operation without using an active temperature stabilizing element. Such cooling elements, commonly known as thermoelectric coolers (TEC), are usually attached to the heatsink of the laser for maintaining the laser temperature at a constant level. The need for TEC's contributes significantly to the complexity and cost of a laser source.

A so-called external cavity laser is known from from Bestwick et al. U.S. Pat. No. 6,101,210. This design, though mentioning that cooling of the laser may not ne necessary, is however limited to narrow bandwidth signal lasers whose power dissipation is much lower compared to the high power lasers addressed by the present invention. Also, Bestwick et al focus on production techniques and do not disclose any reflectivity values or ratios for the laser front facet and/or the grating. Thus, the low power, narrow bandwidth signal lasers disclosed by Bestwick et al. do not provide any indication of how to make or design an uncooled high power laser according to the present invention.

Thus, it is the main object of the invention to devise a simple and reliable laser source with sufficiently large locking range, especially for pump lasers in optical fiber communication systems, that provides a stable output without the need for an active temperature stabilizing element.

A specific object is to avoid the detrimental switching of the laser between operation at a single longitudinal mode and operation at multi-longitudinal modes, even for a laser output power of more than 100 mW, and thus increase the stability of the output of high power laser sources. Output stability shall be achieved for high optical power having reduced noise at low frequencies, wavelength stability and high side-band suppression outside the fiber Bragg grating bandwidth.

A further object is to allow maximum flexibility for choosing the laser's parameters without running into stability problems.

A still further object is to avoid any further complexity and keep the number of additional components of the laser source within a laser pumped optical amplifier to a minimum.

SUMMARY OF THE INVENTION

In accordance with the present invention there is provided a laser source comprising at least one external reflector establishing a high relative feedback for achieving a large locking range with respect to a given operating wave-length. This allows to operate the laser within its locking range without the need for an active temperature stabilizing element.

In accordance with another aspect of the invention the external reflector has an optimized and broadened reflectivity bandwidth with the advantage of achieving a stable power output within the locking range of the laser.

In particular, the front facet reflectivity of the laser is preferably chosen as small as possible, and the reflectivity of the reflector is optimized by design for achieving the high relative feedback. Furthermore, the reflectivity bandwidth of the reflector, defined by the full-width at half maximum (FWHM) bandwidth, is designed to correspond to the equivalent of at least 10 but preferably 20–40 longitudinal Fabry-Perot modes of the laser, thus achieving in combination an optimum locking range and a stable power output of the laser.

In a preferred embodiment of the invention, the external reflector is preferably a fiber Bragg grating having a uniform reflection characteristic, said grating being integrated in the optical fiber used for guiding the laser beam. This simplifies the manufacture and avoids the need to have any parts or components added. Alternatively, other types of reflectors can be used, such as discrete optical interference filters, for example.

In a further embodiment of the invention, the external reflector is a grating formed in a silicon, silicon nitride, or silica waveguide, or formed in a waveguide of any other material. This allows to form the external reflector in a waveguide directly on a chip of the respective material.

In another embodiment of the invention, the shape of the reflection characteristic of the fiber Bragg grating can be linear, flat-top, or the shape resulting from a chirped and/or apodized filter design. This has the advantage of additional design flexibility. Moreover, an apodized grating may avoid lasing at a side-band maximum of the reflection characteristic instead of lasing at the Bragg wavelength, as will be explained in more detail below.

In a still further embodiment of the invention, at least two fiber Bragg gratings within the optical fiber are used for achieving the desired combined reflectivity characteristic. In one embodiment, the fiber Bragg gratings of this plurality have different reflectivity wavelengths by design. Alternatively, the wavelengths may be equal by design, whereby the shift of the reflectivitiy wavelengths is achieved by applying different mechanical stresses and/or different temperatures. This results in even further design flexibility.

In yet another embodiment, an electronic dither imposed by modulating the injection current can be applied in addition and with respect to all previously mentioned embodiments. This would result in the advantage of further improved power stability.

A preferred method for providing the plurality of fiber Bragg gratings is to establish them by simultaneously producing the desired Bragg gratings within the optical fiber. This keeps the efforts for fabricating the additional gratings at a minimum and, at the same time, provides for closer tolerances of the desired layout.

BRIEF DESCRIPTION OF THE DRAWINGS

Preferred embodiments of the invention are described below with reference to the following schematic drawings. The drawings are provided for illustrative purposes and are not necessarily to scale.

DETAILED DESCRIPTION

Figure 1:
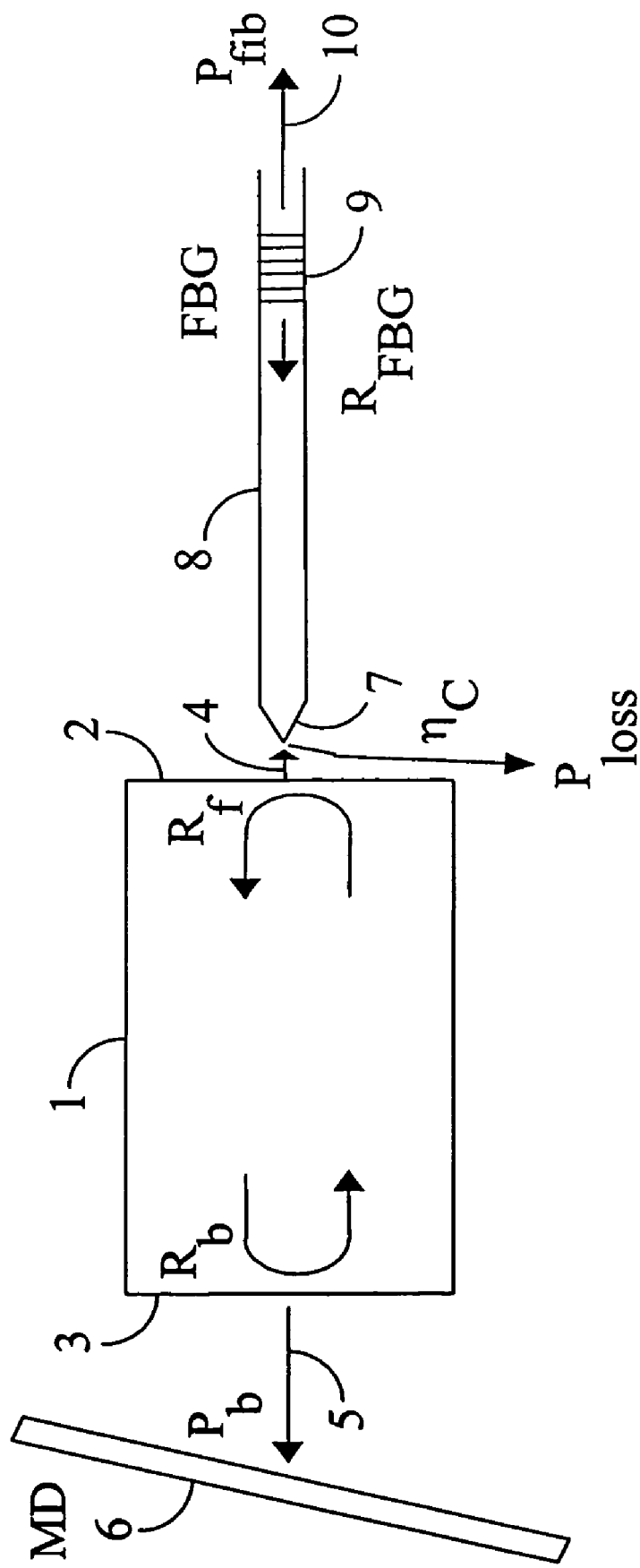
FIG. 1 shows a schematic illustration of a stabilized laser source with a laser, a fiber guide with integrated Bragg grating, and a monitor photodiode.

FIG. 1 shows the basic layout of a first and preferred embodiment according to the invention. A semiconductor diode laser 1, here a high-power diode laser operating at a wavelength of approximately 980 nm, generates a laser beam 4 that is emitted predominantly from the laser front facet 2. At the laser back facet 3, a laser light beam 5 having a low intensity is also emitted, which is detected by a monitoring photodiode 6. The monitoring photodiode 6 converts the light received to a back facet monitoring (BFM) current for controlling the laser injection current in a feedback loop. The laser light beam 4 is coupled into a suitable guide means 8, preferably an optical fiber, via a fiber lens 7, focusing the laser beam 4 onto the input end of the optical fiber 8. Within the optical fiber 8, an optical reflector 9, preferably a fiber Bragg grating (FBG), is arranged. From a manufacturing viewpoint, the well-known FBG fabrication is based on exposure to UV radiation having a periodic intensity along a piece of the optical fiber, as described e.g. by Raman Kashyap in "Fiber Bragg Gratings", Academic Press, 1999. A stabilized fiber exit beam 10 leaves the optical fiber 8 and is fed into a fiber amplifier, e.g. an erbium-doped fiber amplifier not shown here.

In the following, the operation principle of a stabilized laser source using a FBG as reflector is presented. In a high-power semiconductor diode laser, the back facet is coated with a high-reflectivity filter having a reflectivity $R_B$ at the design wavelength, whereas the front facet is coated with a low-reflectivity filter (anti-reflection coating) having a reflectivity $R_F$ at the design wavelength. Most of the laser light is thus emitted from the front facet and is coupled into the optical fiber via the fiber lens. The power coupling efficiency $\eta_c$ defines the proportion of light coupled into the optical fiber via the fiber lens arrangement. Typical values of around 0.7 may be achieved with mass production means, whereas a value of up to 0.85 may be achieved in a controlled laboratory environment. The laser light further propagates within the optical fiber towards the FBG having a reflectivity $R_{FBG}$ at the design wavelength. The partial reflection of the laser light by the FBG into the laser thus causes a delayed feedback.

The feedback strength, also called the relative feedback $r_{FB}$, can be defined as $$r_{FB} = \eta_c^2 R_{FBG}(1-R_F)^2/R_F \approx c^2 R_{FBG}/R_F \text{ for } R_F \ll 1,$$

which reduces approximately to the ratio of the FBG's reflectivity (including the power coupling efficiency squared) and the laser's front facet reflectivity, if the latter is much smaller than one. The term $\eta_c^2$ may be considered a constant k for a given arrangement and defined materials.

According to this formula it is clear that the relative feedback can be increased by decreasing the front facet reflectivity, and/or by increasing the power coupling efficiency, and/or by increasing the reflectivity of the FBG.

Figure 2:
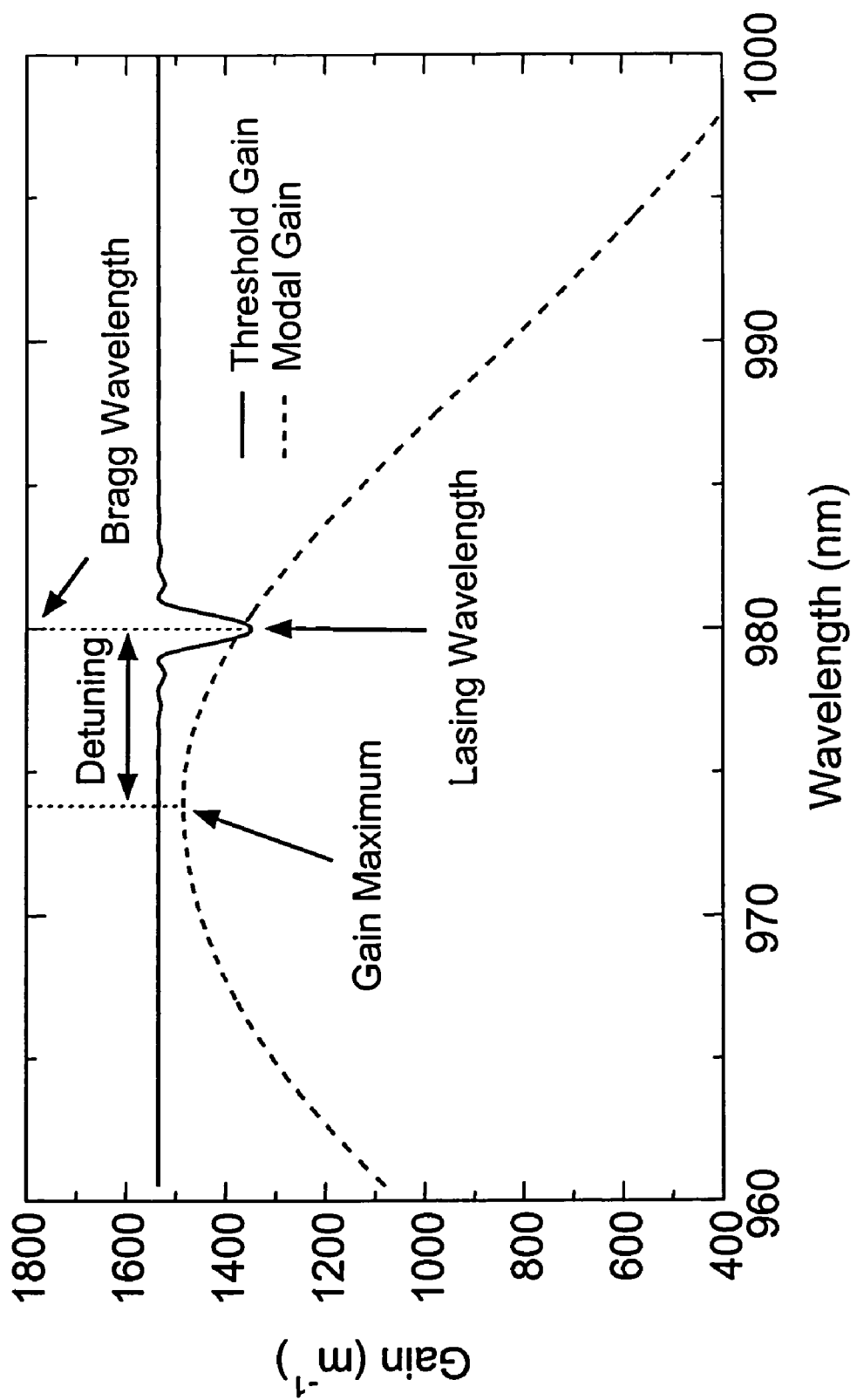
FIG. 2 shows a graph of the threshold gain and the laser modal gain, indicating the resulting lasing wavelength.

The reflection characteristic of the FBG forces the laser diode to emit laser light not around the modal gain maximum of the laser, but at wavelengths centered at the FBG wavelength, as shown in FIG. 2. In other words, the laser source will lase at the wavelength where the laser modal gain equals the laser threshold gain. For a given detuning between the modal gain maximum and the FBG's wavelength, the lasing wavelength will be around the Bragg wavelength if the reflectivity of the FBG is high enough. For such a situation it is said that the laser is locked by the FBG. With increasing heatsink temperature and/or laser injection current the modal gain curve will shift towards longer wavelengths thus yielding a varying detuning. The wavelength range over which the position of the modal gain maximum can be tuned while continuously maintaining locking with the FBG, is defined as the locking range of the laser.

Figure 3:
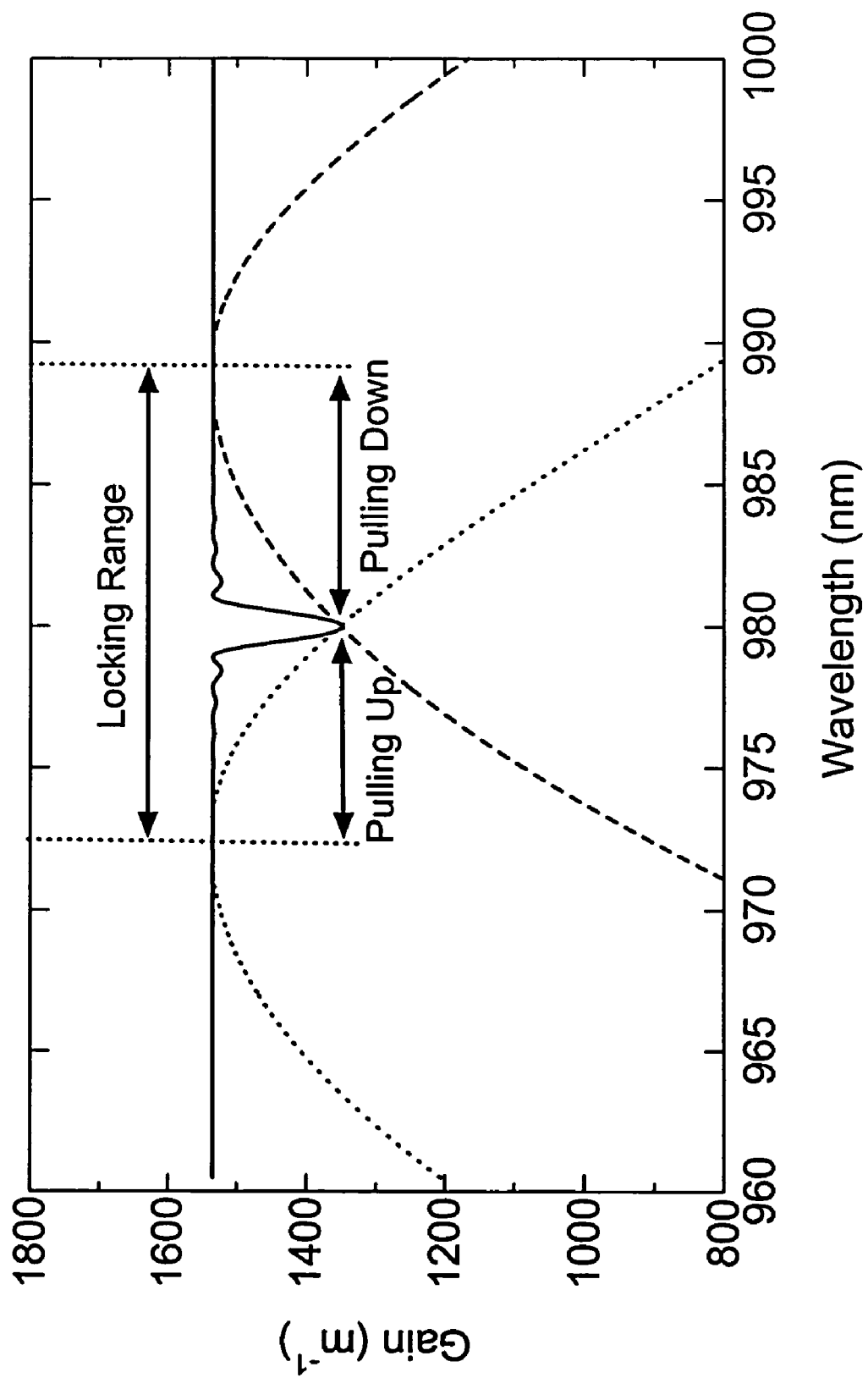
FIG. 3 shows a graph of the threshold gain and the laser modal gain for different laser temperatures, indicating the resulting locking range.

FIG. 3 shows the total locking range which is the sum of the locking range for pulling-up operation (modal gain maximum below the Bragg wavelength) and pulling-down operation (modal gain maximum above the Bragg wavelength). FIG. 3 further shows equal threshold gain and modal gain at wavelengths corresponding to the FBG central wavelength, and the maxima of the modal gain curves, respectively. This situation causes the emission of laser light with equal power at both the FBG wavelength, and at the maxima of the modal gain curves. Hence, the locking range can be defined on both sides by a sideband suppression ratio of 0 dB.

Figure 4:
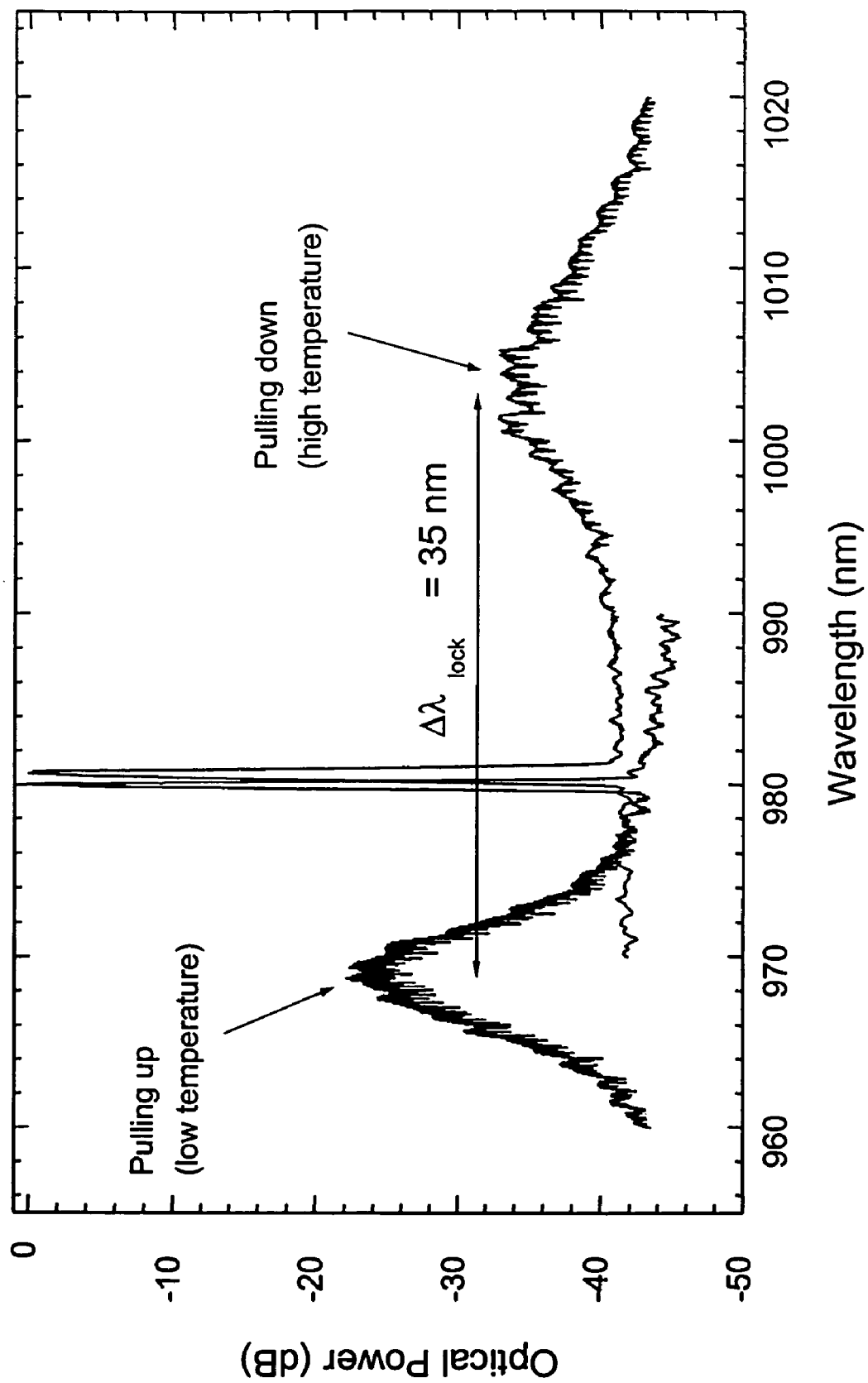
FIG. 4 shows a graph of the laser power spectrum for different heatsink temperatures, indicating the resulting locking range.

Of practical interest, however, is the locking range expressed in the maximum variation of the laser heatsink temperature. In FIG. 4, the laser power spectrum for both a low and a high heatsink temperature is shown. As is clearly seen, the side-band peak of the laser power is suppressed by more than 20 dB for the low temperature where the laser operates in the pulling-up regime, and by more than 30 dB for the high temperature where the laser operates in the pulling-down regime. For practical applications, a side-band suppression ratio of at least −10 dB to −20 dB might be given as a specification value. In a state-of-the-art configuration, the relative feedback is set to a value of the order of one, i.e. $r_{FB}=1$. This is typically achieved with values of $R_F=1\%$, $R_{FBG}=2\%$, and $\eta_c=0.7$. Such a low relative feedback level is sufficient for applications requiring an active temperature stabilizing element, such as a thermoelectric cooling element (TEC) attached to the heatsink for keeping the temperature variations of the laser within limits.

In accordance with the present invention, a range of −5° C. to 85° C. of the heatsink temperature has to be allowed if the laser source is operated without a TEC. Under such conditions, the wavelength of the modal gain maximum of the free-running laser shifts over a large range (e.g. from 965 nm to 1005 nm). Thus a locking range of around 40 nm or even more is required. Moreover, the power of the stabilized fiber exit beam should clearly be in excess of 100 mW.

Figure 5:
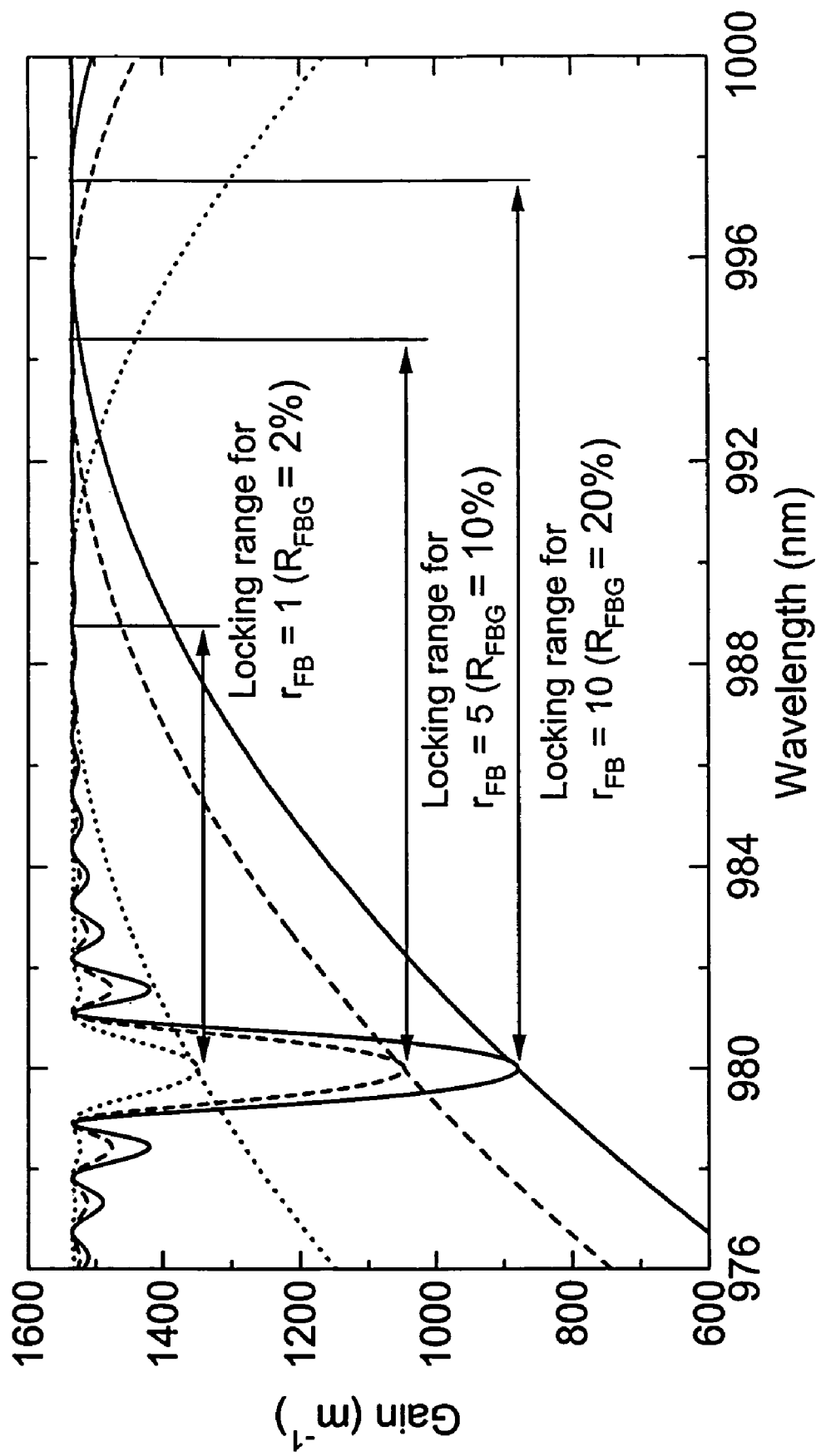
FIG. 5 shows a graph of the threshold gain for different relative feedback levels ($r_{FB}$) and the laser modal gain for different heatsink temperatures, indicating the resulting locking range for pulling-down operation.

Moreover in accordance with the present invention, the locking range for wavelength stabilization is strongly increased by increasing the relative feedback to values of $r_{FB}=5-10$. Simulation results shown in FIG. 5 demonstrate how the locking range increases if the FBG reflectivity $R_{FBG}$ is increased from 2% to 10% and 20%, corresponding to a relative feedback $r_{FB}$ of 1, 5, and 10, respectively. In FIG. 5, the results apply for $\eta_c=0.7$, and $R_F=1\%$. As explained above, the relative feedback can be increased by inceasing the fiber Bragg grating reflectivity and/or the power coupling efficiency, and/or by decreasing the front facet reflectivity.

Figure 6:
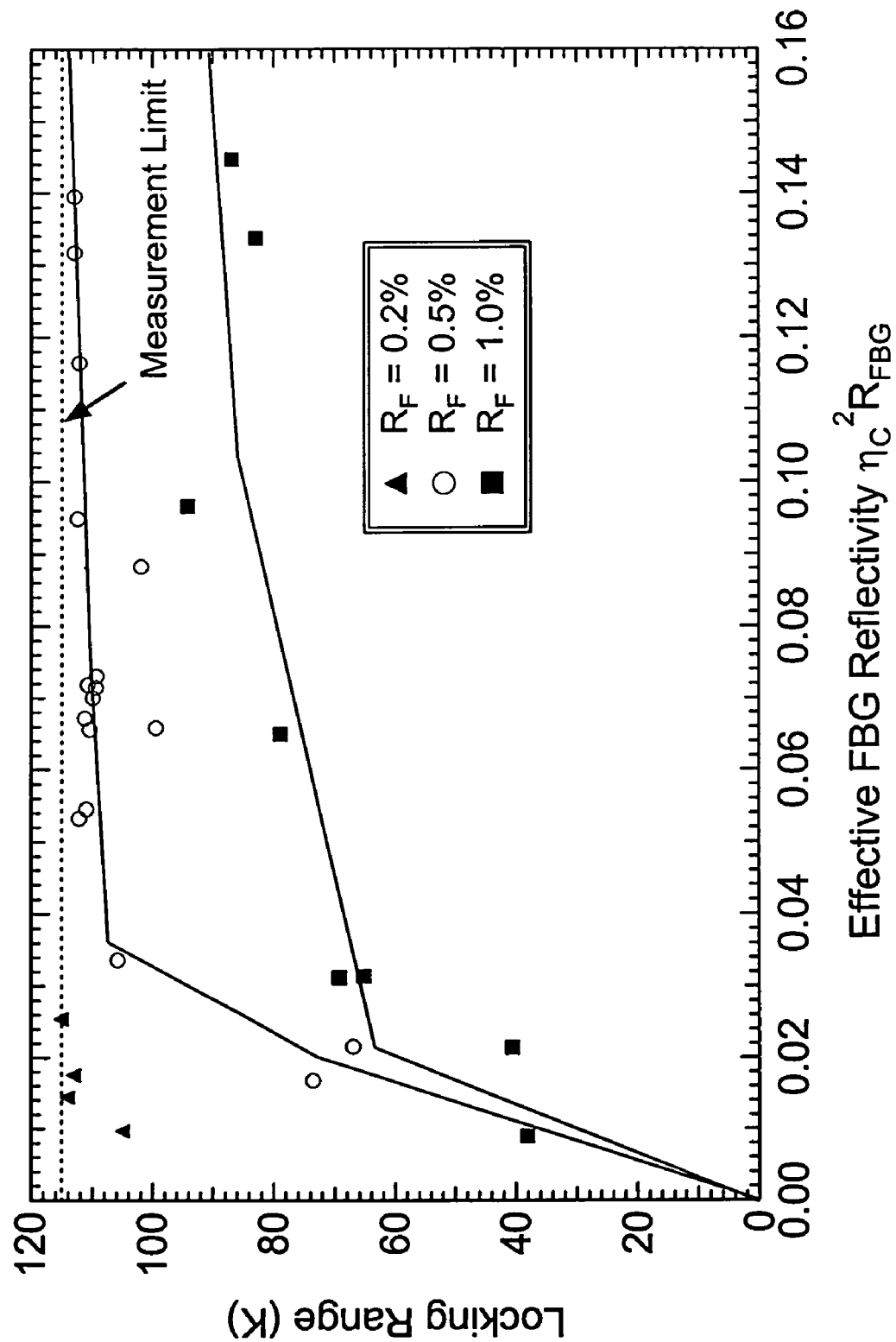
FIG. 6 shows a graph of the locking range in units of temperature for different effective fiber Bragg grating (FBG) reflectivites, $\eta_c^2 R_{FBG}$, and front facet reflectivities (FFR), $R_F$.

FIG. 6 shows measurement data indicating the locking range plotted against the effective FBG reflectivity $\eta_c^2$ RFBG for three different values of the front facet reflectivity $R_F$. Here, the locking range is given as the temperature range over which the laser can be locked. This definition of the locking range is equivalent to the definition given above, if the shift of the modal gain curve with temperature, given in nm/K, is known. As can clearly be seen, the locking range increases with increasing effective FBG reflectivity. Moreover, for a given FBG reflectivity, the locking range also increases with a decreasing front facet reflectivity. It is further noted that for a very high relative feedback, the locking range is saturating at a certain level depending on the front facet reflectivity and further laser parameters. For the example shown in FIG. 6, it is found that the saturation starts at a relative feedback level of 5 to 10.

In other words, the measurement data shown in FIG. 6 clearly exhibit the improvement of the locking range over a wide temperature range. This is one important aspect to which the present invention provides a solution.

However, increasing the relative feedback to very high values also has a detrimental effect on the noise performance. Furthermore, as is found from experimental data as well as from numerical simulation, increasing the relative feedback without suitable compensation produces disturbing nonlinearities of the laser power versus injection current, i.e. the P/I characteristic.

Figure 7:
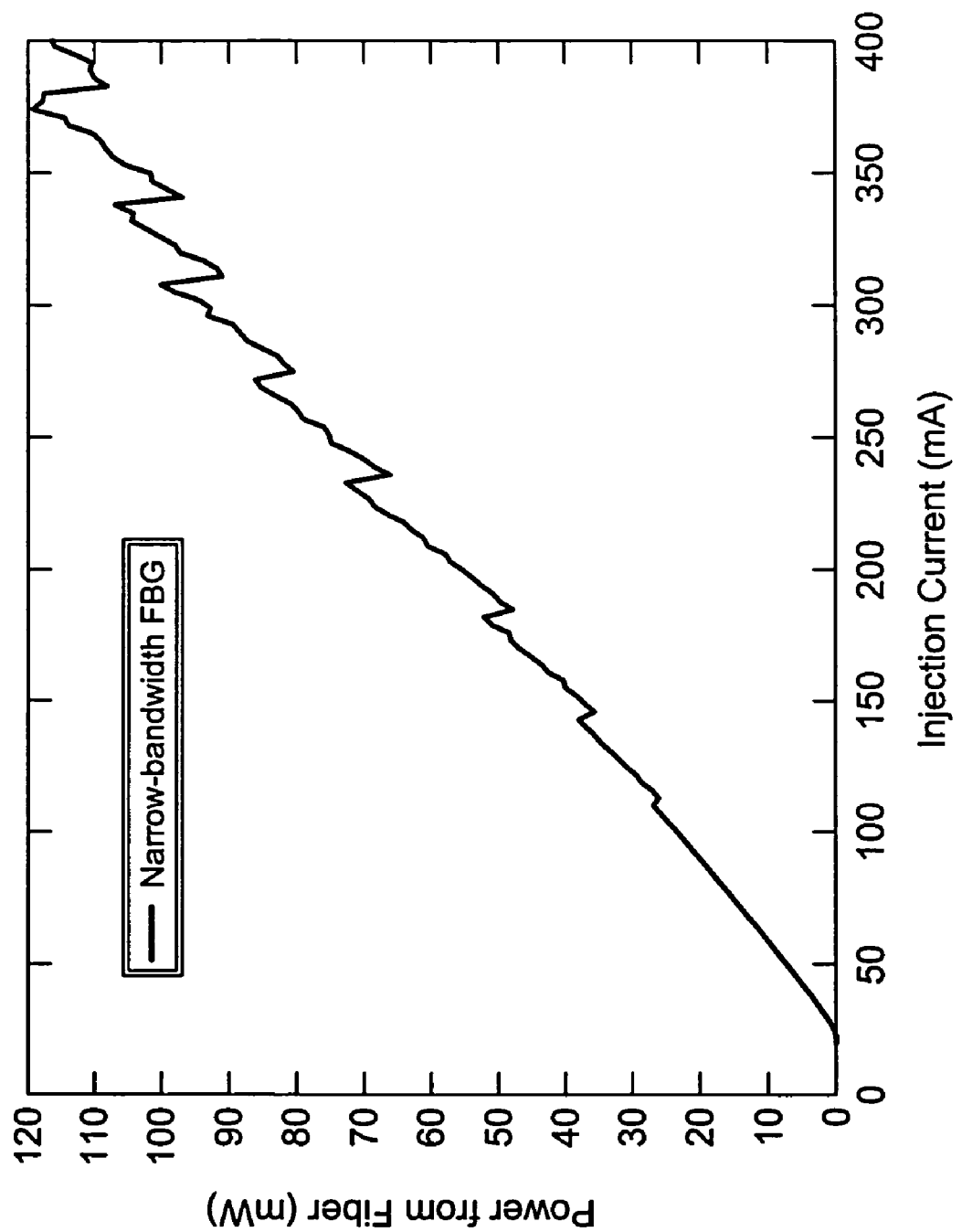
FIG. 7 shows a graph of the laser power exiting the fiber guide versus the laser injection current, for a narrow FWHM bandwidth (0.5 nm) of the FBG.

FIG. 7 shows the measured power of the exiting laser beam (power from fiber after the grating), of a laser source for a very high relative feedback value of $r_{FB}=13$ with uncompensated FWHM reflectivity bandwidth of the FBG, which typically has a value of 0.5 nm for state-of-the-art implementations. The resulting saw-tooth shape is clearly unacceptable for high-power pump laser sources. The kinks in the P/I characteristic can be used as a first criterion for assessing the quality of the laser source.

A second criterion can be derived from the measurement of the time series of the laser power variation for a fixed injection current. The power variation can be quantified by the expression $\delta P_{dB} = -10 \lg (1 - \Delta P_{max}/P_{mean})$, where $P_{mean}$ is the mean power value averaged over the time sampling interval, and $\Delta P_{max}$ is the maximum power variation within the sampling time interval, i.e. the difference between the maximum and minimum power value. For typical applications, a specification of the power variation below 0.15 dB might be given.

It has been found experimentally that increasing the FBG FWHM reflectivity bandwidth beyond values used in state-of-the-art implementations yields a reduction of the power variations with time. Furthermore, the linearity of the P/I characteristic is also improved.

Figure 8:
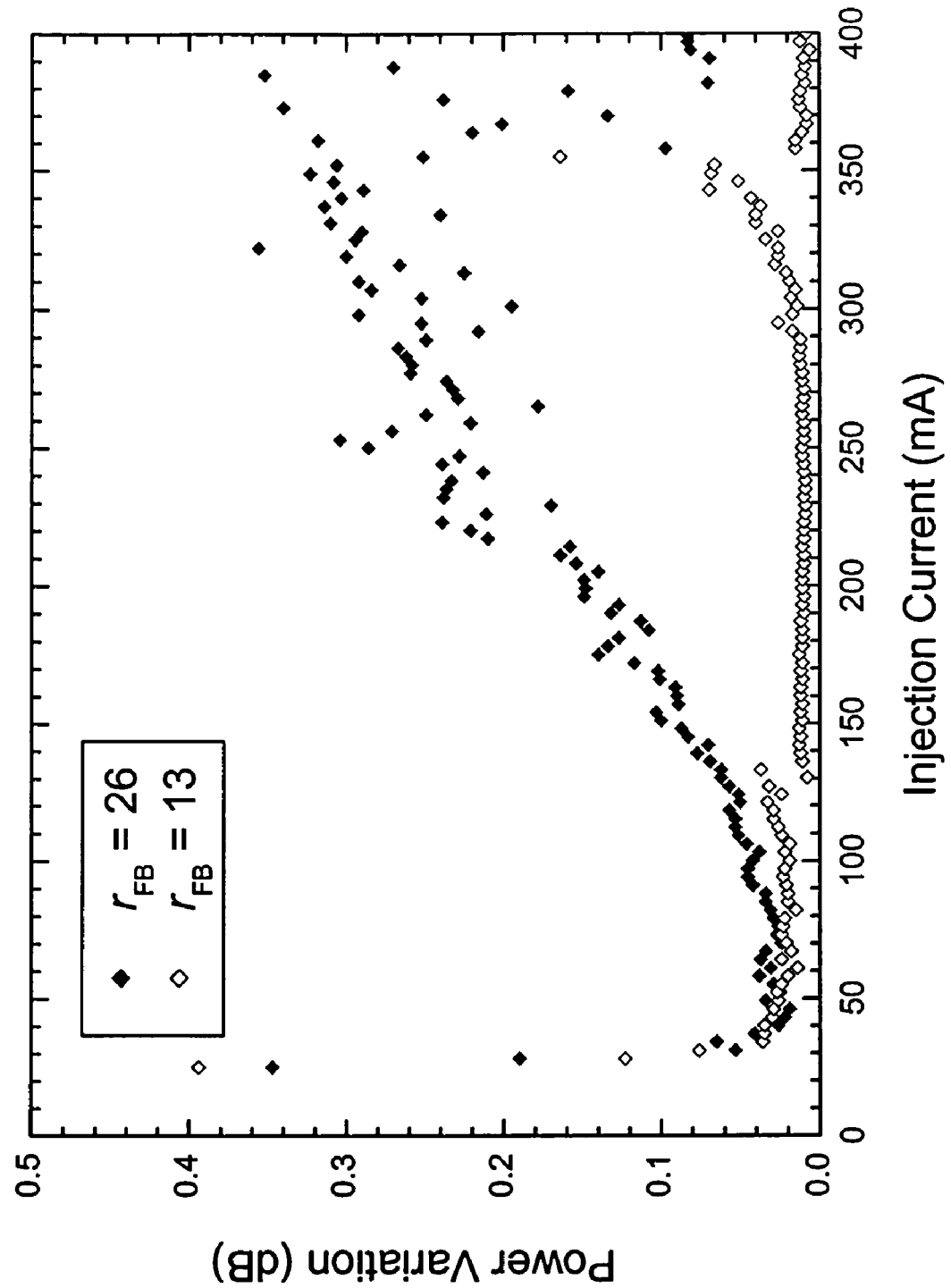
FIG. 8 shows a graph of the laser power variation for different levels of relative feedback ($r_{FB}$).

FIG. 8 shows the measured power variation of a laser source for high relative feedback values of $r_{FB}=13$, and $r_{FB}=26$, plotted against the injection current. Here, the FWHM reflectivity bandwidth of the FBG is broadened to 2.8 nm, and 2.5 nm, respectively. FIG. 8 further shows that the specification $\Delta P_{dB} < 0.15$ dB cannot be met for an extremely high relative feedback ($r_{FB}=26$), however, the specification is met for a very high relative feedback ($r_{FB}=13$) for injection currents up to 350 mA.

Figure 9:
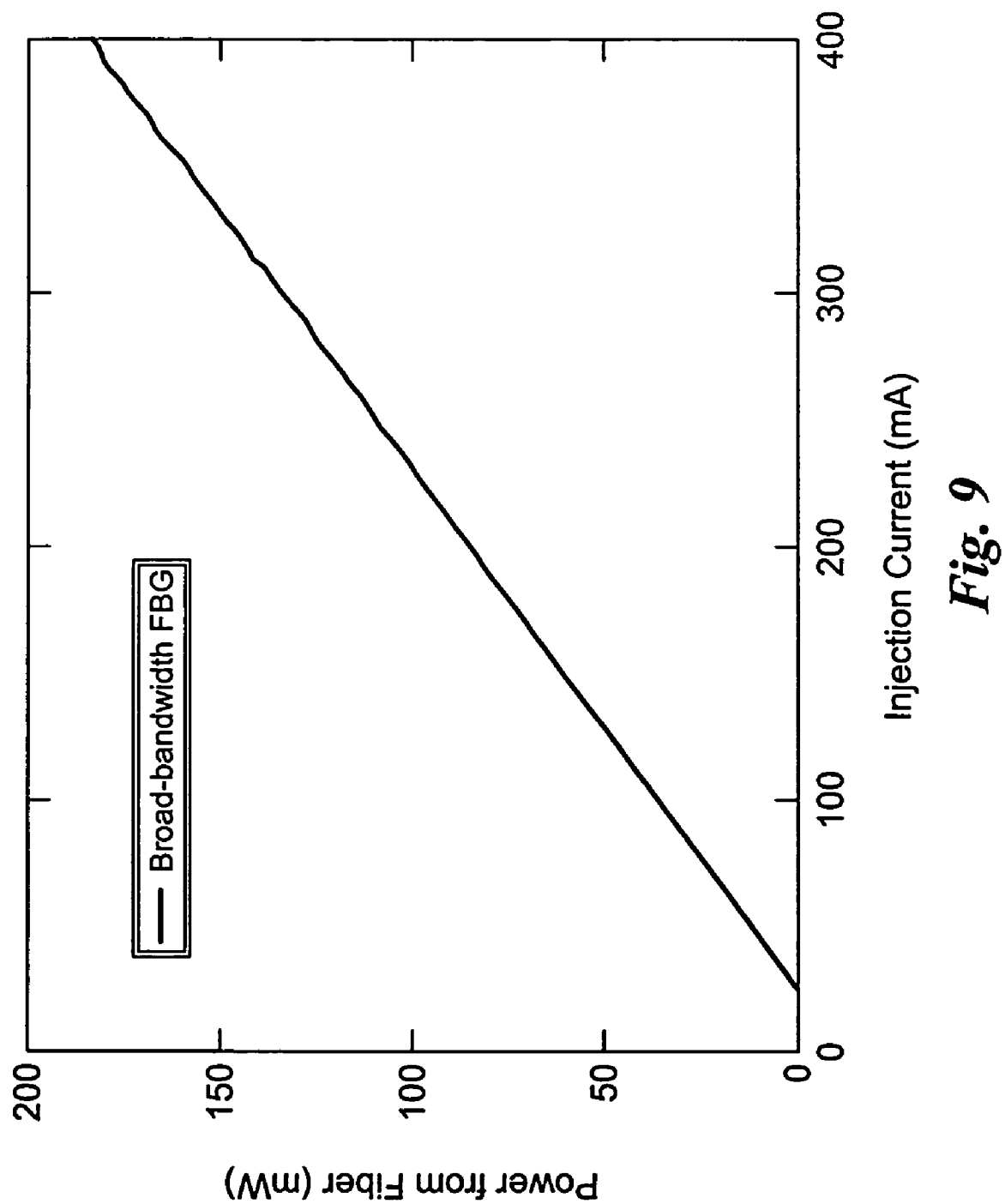
FIG. 9 shows a graph of the laser power exiting the fiber guide versus the laser injection current, for a broad FWHM bandwidth (2.8 nm) of the FBG.

FIG. 9 shows the P/I characteristic for a relative feedback $r_{FB}=13$ and an FBG FWHM bandwidth of 2.8 nm. These curves correspond to the open diamond symbols shown in FIG. 8. A comparison with FIG. 7 clearly demonstrates the improvement with respect to the linearity of the P/I characteristics. It has been found that the optimum FWHM reflectivity bandwidth, also denoted as $\square \Delta_{FWHM}$, scales with the spectral separation of the longitudinal Fabry-Perot (FP) modes, $\Delta \lambda_{FP}$, of the internal laser cavity. The internal cavity modes are defined by the free-running laser chip (without FBG). The optimum number of longitudinal modes within the FWHM reflectivity bandwidth is between 20 and 40, i.e. $\Delta \lambda_{FWHM}/\Delta \lambda_{FP} = 20-40$. In other words, FIGS. 8 and 9 demonstrate that a FBG with optimized FWHM reflectivity bandwidth establishes the desired P/I linearity as well as the specified power variation for laser sources operating with very high relative feedback, thus addressing another aspect of the present invention.

In a second embodiment, the FBG with uniform reflection characteristic is replaced by an FBG having a non-uniform reflection characteristic with optimized FWHM reflectivity bandwidth. Such non-uniform reflectivity filter functions may exhibit a flat-top filter characteristic, or a linear filter characteristic, or a filter characteristic obtained by a chirped and/or apodized FBG.

Figure 10:
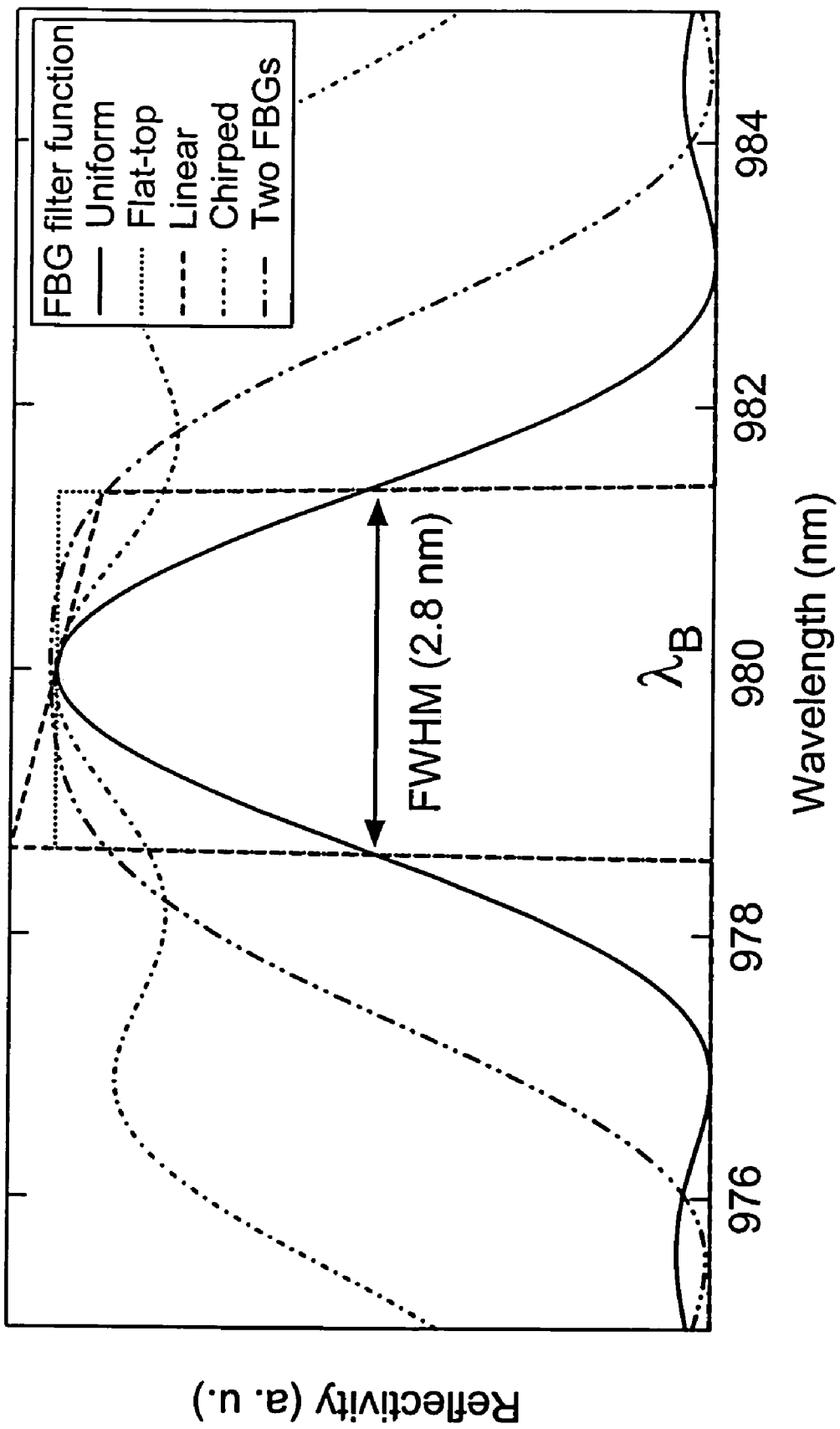
FIG. 10 shows a graph of different FBG reflectivity filter functions with broad FWHM bandwidth.

FIG. 10 shows reflectivity spectra of the various realizations just mentioned. Here, the reflectivity spectrum of a uniform FBG with FWHM reflectivity bandwidth of 2.8 nm is shown as a reference spectrum. Simulation results indicate that FBGs with specially designed filter functions may be an option for realizing even smaller power variations and smoother P/I characteristics than those achieved with a uniform reflection characteristics. The filter function of an uniform FBG shows side-band maxima at equidistant spectral positions far from the main peak.

Figure 11:
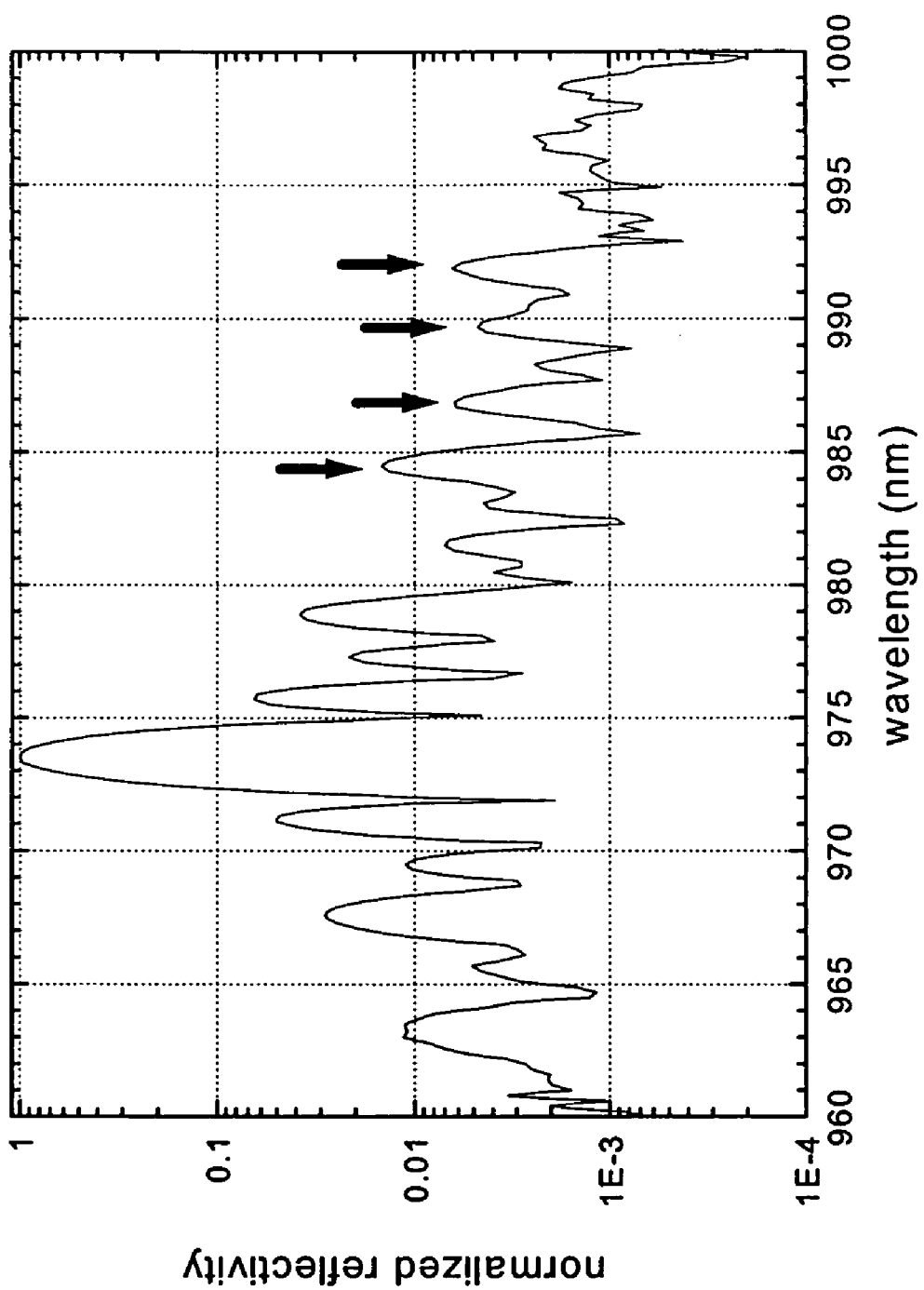
FIG. 11 shows a graph of the measured reflectivity spectrum of a nominally uniform FBG.

As an example, FIG. 11 shows the measured reflectivity spectrum of a nominally uniform FBG with a peak reflectivity of 10% at a wavelength of 974 nm. For large detunings between the gain maximum and the grating's Bragg wavelength, it is possible that the module will be locked (additionally or exclusively) to wavelengths around side-band maxima. In particular, the probability for such an unfavorable behavior increases taking into account manufacturing tolerances of commercially available Bragg gratings.

Figure 12:
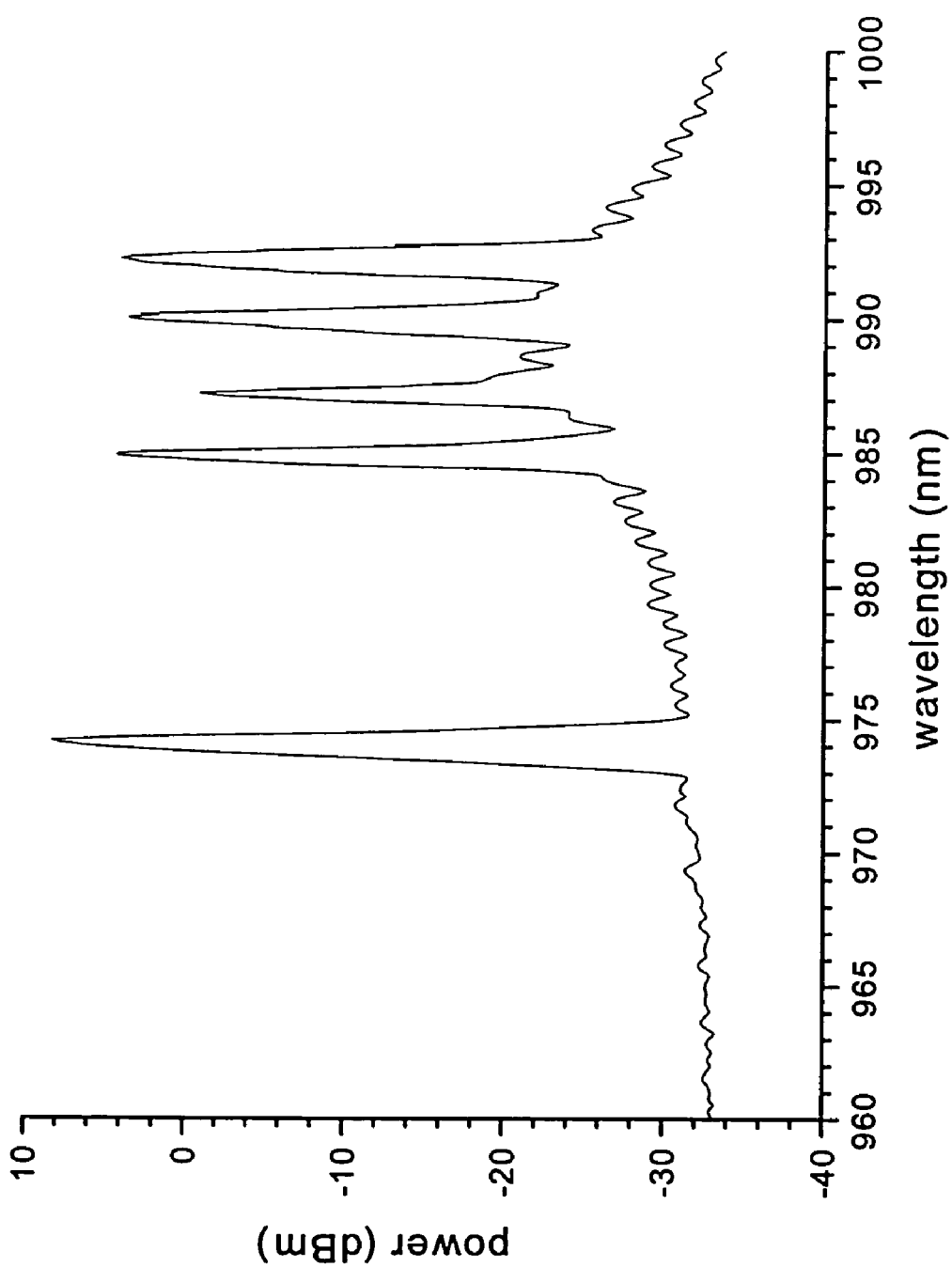
FIG. 12 shows a graph of the measured optical power spectrum obtained with the reflection characteristic of the uniform FBG shown in FIG. 11.

This is demonstrated by the power spectrum shown in FIG. 12 which is measured at a certain high-temperature condition using the FBG just mentioned. The four strong side peaks far beyond 974 nm are explained by simultaneous lasing of the module at side-band maxima, as indicated by the arrows in FIG. 12. Such features may be avoided by the use of apodized gratings because apodization eliminates or minimizes side-band maxima in the reflection spectrum. Thus, apodized FBGs increase the range of wavelength-stabilized operation.

Figure 13:
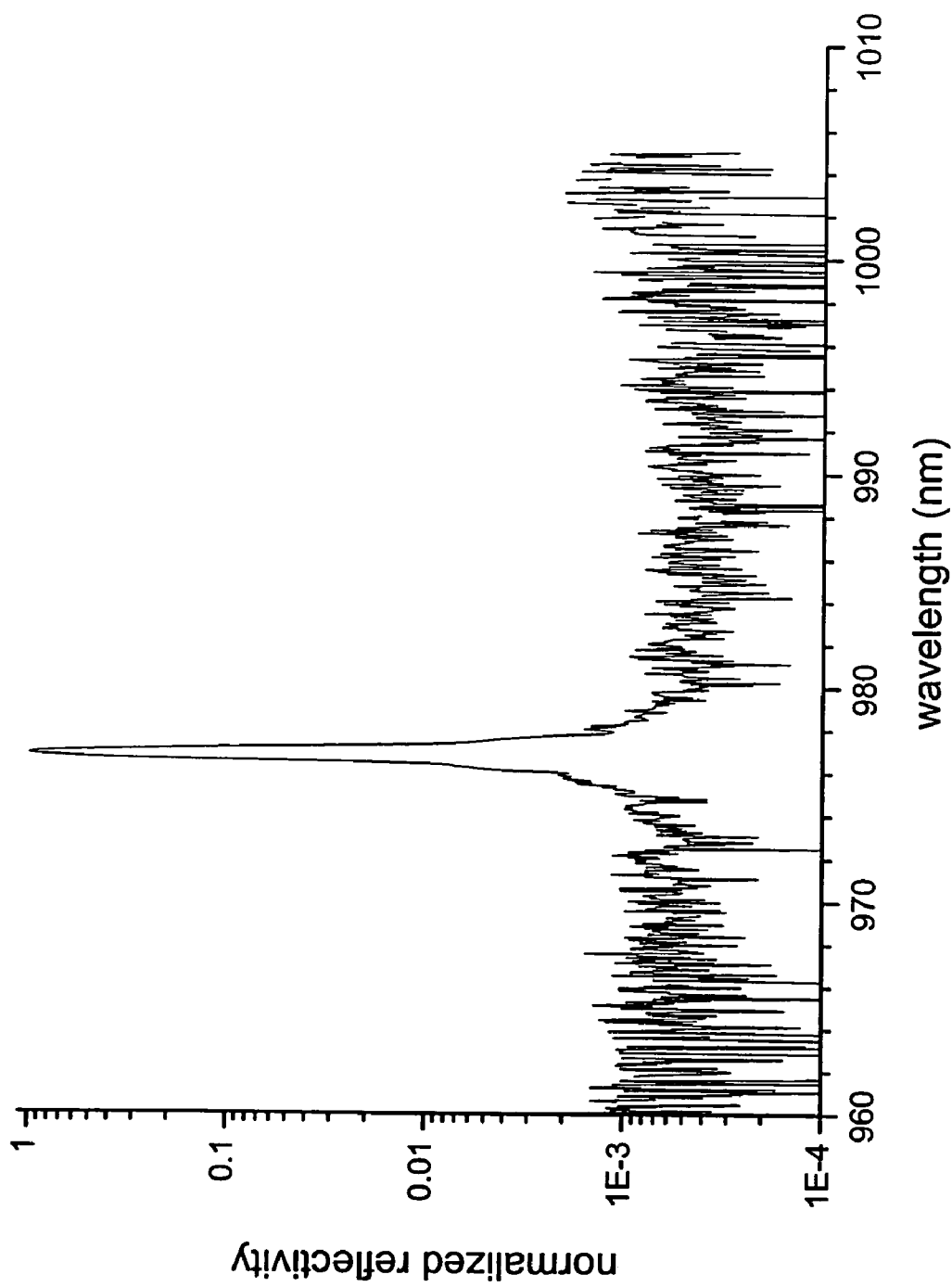
FIG. 13 shows a graph of the measured reflectivity spectrum of an apodized (unchirped) FBG

As an example, FIG. 13 shows the measured reflectivity spectrum of an apodized FBG. Compared to FIG. 11, no side-band maxima are visible in the reflectivity spectrum.

Figure 14:
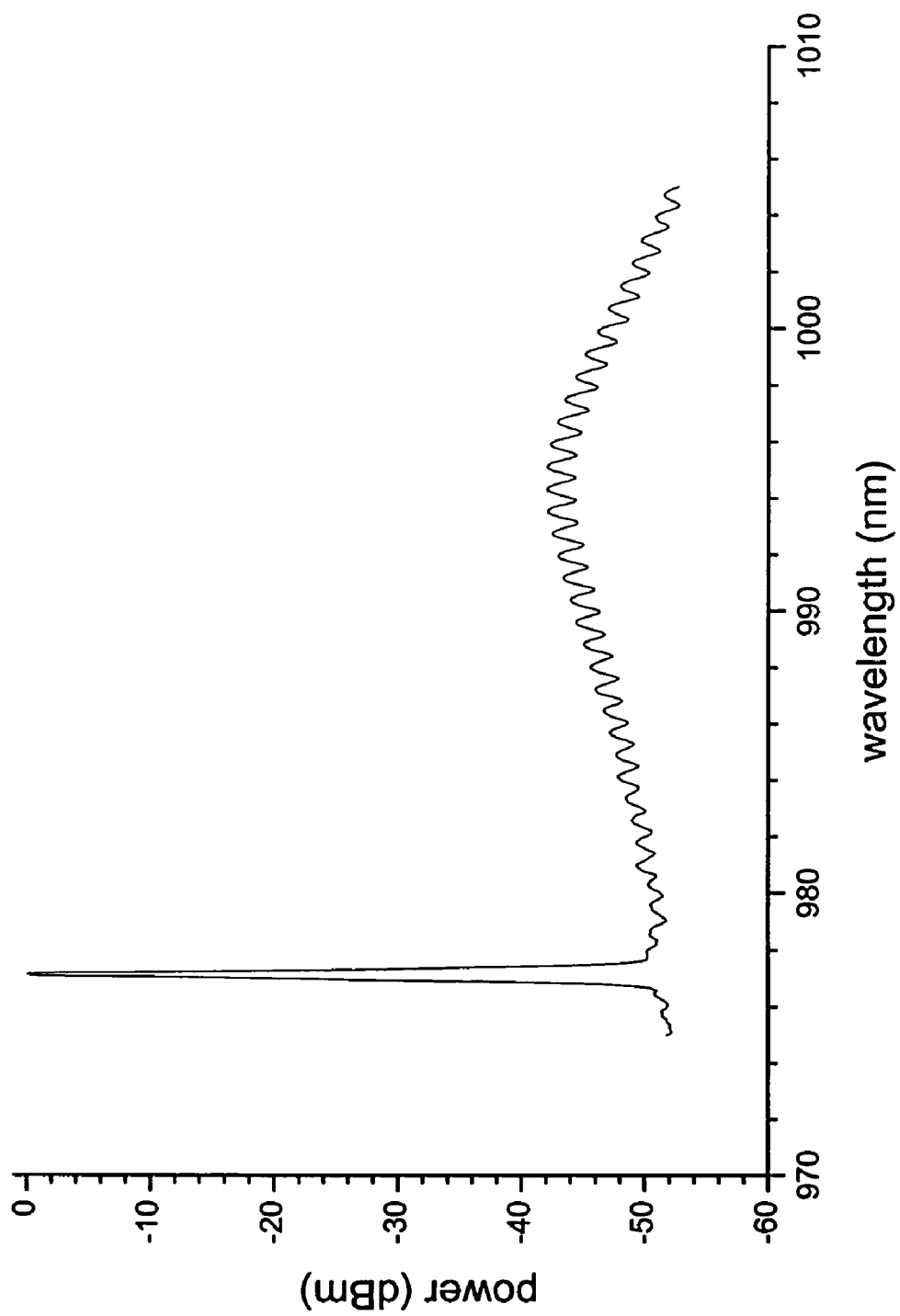
FIG. 14 shows a graph of the measured optical power spectrum obtained with the reflection characteristic of the apodized FBG shown in FIG. 13.

FIG. 14 shows the optical power spectrum obtained with the apodized FBG for similar conditions as the spectrum shown in FIG. 12. Here, the spectrum indicates that the module is well locked to the FBG's Bragg wavelength, in contrast to the previous example.

In a third embodiment, at least two FBGs with different central Bragg wavelengths are used, the combined filter characteristic providing an optimum filter characteristic according to the teaching given above. The at least two FBGs are arranged in series and within the optical fiber. This can be realized with FBGs having different central wavelengths by design. Alternatively, the at least two FBGs can be identical by design, whereby shifted central wavelengths are obtained by inducing different mechanical stress on the FBGs, and/or by heating up the FBGs to different temperatures. As an example, FIG. 10 also shows a reflectivity spectrum obtained with two FBGs.

In a fourth embodiment, an electronic dither imposed by modulating the laser injection current can be applied in addition and with respect to all previous embodiments mentioned above.

Figure 15:
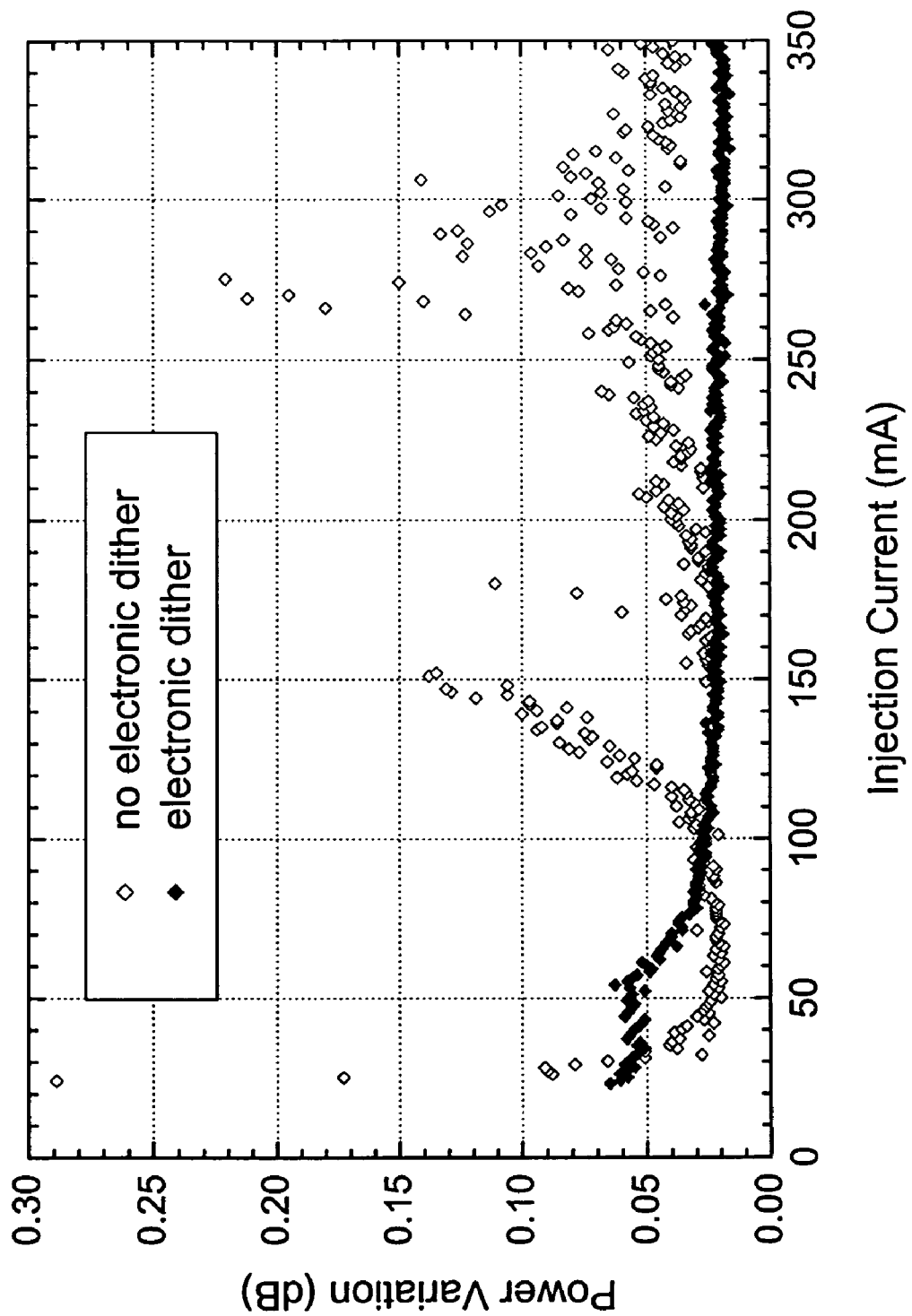
FIG. 15 shows a graph of the laser power variation with, and without electronic dither imposed on the laser injection current.

FIG. 15 finally shows the effect on the power variation of a laser source with and without electronic dither applied. The resulting improvement with respect to a reduced power variation when applying the electronic dither is clearly shown.

In principle, any of the various embodiments described above will look similar or even identical to the schematic structure shown in FIG. 1, and a person skilled in the art should have no problem to determine and vary the technical details, in particular the spatial arrangement. As clearly described, the important aspects of the invention are the unusual selection of various dimensions contrary to the state-of-the-art. These unusual dimensions provide the desired improved function of the present invention.

The invention claimed is:

1. A high power laser source for generating a stable exit beam at a given wavelength, said laser source comprising a laser diode and guide means for conducting a laser beam, said laser diode including a reflecting front facet and said guide means including at least one reflector, wherein said reflector has a reflectivity $R_{FBG}$, centered at the desired wavelength of said exit beam, said front facet has a reflectivity $R_F$ towards said guide means, said reflectivities $R_{FBG}$ and $R_F$ being selected to achieve a predetermined relative feedback $$r_{FB} = k * R_{FBG}/R_F > 5,$$

k being a factor determined by the coupling efficiency within said guide means, said guide means' length and said at least one reflector's reflectivity $R_{FBG}$ are selected to warrant multimode operation with at least 10 longitudinal Fabry-Perot internal modes, and said laser source is uncooled, i.e., has no active cooling element.

2. The laser source according to claim 1, wherein the relative feedback $r_{FD}$ is between 5 and 10.

3. The laser source according to claim 1, wherein the reflectivity $R_F$ of the laser's front facet towards the guide means is less than 10%.

4. The laser source according to claim 3, wherein the reflectivity $R_F$ of the lasers front facet towards the guide means is less than 1%.

5. The laser source according to claim 1, wherein the FWHM reflectivity bandwidth of the reflector corresponds to the equivalent of at least 20–40 longitudinal Fabry-Perot internal modes of the laser diode.

6. The laser source according to claim 1, wherein the reflector is a grating integrated within the guide means.

7. The laser source according to claim 6, wherein the reflector is a fiber Bragg grating grating within a fiber, the latter forming part of the guide means.

8. The laser source according to claim 1, wherein the guide means includes a waveguide consisting of or comprising silicon nitride ($Si_3N_4$), silica ($SiO_2$), or silicon (Si).

9. The laser source according to claim 6, wherein the grating is an apodized grating.

10. The laser source according to claim 1, wherein at least two gratings are provided, at least one of them integrated within the guide means.

11. The laser source according to claim 10, wherein at least of the provided gratings is a fiber Bragg grating.

12. The laser source according to claim 10, wherein the two or more gratings have different central wavelengths by design.

13. The laser source according to claim 10, wherein the two or more gratings are similar or identical by design, but have different central wavelengths generated by applying mechanical and/or thermal stress.

14. The laser source according to claim 6, wherein the grating exhibits a non-uniform reflection characteristic resulting in a predetermined filter function.

15. The laser source according to claim 14, wherein the preselected filter function has a flat-top shape.

16. The laser source according to claim 14, wherein the preselected filter function has a linear shape.

17. The laser source according to claim 14, wherein the grating is a chirped grating resulting in a preselected chirped filter function shape.

18. The laser source according to claim 14, wherein the grating is an apodized grating resulting in a filter function shape with suppressed side-band maxima.

19. The laser source according to claim 12, wherein at least one of the gratings is a chirped and apodized grating resulting in a preselected chirped filter function shape with suppressed side-band maxima.

20. The laser source according to claim 1, wherein an electronic dither is superimposed on an injection current of the laser diode for improving the power stability of the laser exit beam.

21. The laser source according to claim 1, wherein the laser is a semiconductor diode laser.

22. The laser source according to claim 21, wherein the laser is an InGaAs quantum well diode laser.

23. The laser source according to claim 1, wherein the laser guide means comprises a polarization-maintaining or a non-polarization-maintaining optical fiber.

24. The laser source according to claim 1, wherein the guide means includes means for directing the laser beam into an optical fiber.

25. The laser source according to claim 23, wherein the means for directing the laser beam into the optical fiber includes beam collimating or focusing means attached to or integrated into said optical fiber.

26. A method of making a high power laser source with laser diode and laser beam guide means in front of said laser diode, comprising the steps of:

manufacturing a front facet on said laser diode with a selected reflectivity $R_F$ towards said guide means, manufacturing at least one reflector with a selected reflectivity $R_{FBG}$, said reflectivities $R_{FBG}$ and $R_F$ being chosen to achieve a predetermined relative feedback $r_{FB} = k * R_{FBG}/R_F > 5$, wherein k is determined by the coupling efficiency within said guide means, and selecting said guide means' length and said at least one reflector's reflectivity $R_{FBG}$ to warrant multimode operation with at least 10 longitudinal Fabry-Perot internal modes.

27. The method according to claim 26, whereby the at least one reflector with a selected reflectivity $R_{FBG}$ is manufactured within said laser beam guide means.

28. The method according to claim 26, whereby the manufacturing of the reflector is carried out by UV exposure creating said reflector as fiber Bragg grating in an optical fiber constituting part of the laser beam guide means.

* * * * *